(12) United States Patent
Coolbaugh et al.

(10) Patent No.: US 8,609,505 B2
(45) Date of Patent: Dec. 17, 2013

(54) METHOD OF FORMING MIM CAPACITOR STRUCTURE IN FEOL

(75) Inventors: Douglas D. Coolbaugh, Highland, NY (US); Ebenezer E. Eshun, Newburgh, NY (US); Robert M. Rassel, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 13/359,032

(22) Filed: Jan. 26, 2012

(65) Prior Publication Data
US 2012/0122293 A1    May 17, 2012

Related U.S. Application Data

(62) Division of application No. 12/618,830, filed on Nov. 16, 2009, now Pat. No. 8,125,049.

(51) Int. Cl.
*H01L 27/06* (2006.01)
*H01L 27/07* (2006.01)
*H01L 21/20* (2006.01)

(52) U.S. Cl.
USPC ........... 438/396; 438/397; 257/506; 257/532; 257/535; 257/754; 257/755; 257/758; 257/E27.016; 257/E27.025; 257/E27.034

(58) Field of Classification Search
USPC ................. 257/532, 506, 535, 754, 755, 758, 257/E27.016, E27.025, E27.034; 438/396, 438/397
See application file for complete search history.

(56) References Cited

U.S. PATENT DOCUMENTS

| | | | |
|---|---|---|---|
| 5,688,713 A | 11/1997 | Linliu et al. | |
| 6,351,005 B1 | 2/2002 | Al-Shareef et al. | |
| 6,391,307 B1 * | 5/2002 | Kumon | 424/750 |
| 6,521,934 B2 * | 2/2003 | Yasuda | 257/296 |
| 6,656,786 B2 | 12/2003 | Chiang et al. | |
| 6,670,663 B2 | 12/2003 | Hwang et al. | |
| 6,822,283 B2 | 11/2004 | Lin et al. | |
| 6,849,387 B2 | 2/2005 | Chiang et al. | |
| 6,927,440 B2 | 8/2005 | Greco et al. | |
| 7,122,878 B2 | 10/2006 | Huang et al. | |

(Continued)

OTHER PUBLICATIONS

U.S. Appl. No. 12/618,830, filed Nov. 16, 2009, Notice of Allowance and Fees Due dated Oct. 26, 2011.

(Continued)

*Primary Examiner* — Victor A Mandala
(74) *Attorney, Agent, or Firm* — David A. Cain; Hoffman Warnick LLC

(57) ABSTRACT

A capacitor structure includes a semiconductor substrate; a first capacitor plate positioned on the semiconductor substrate, the first capacitor plate including a polysilicon structure having a surrounding spacer; a silicide layer formed in a first portion of an upper surface of the first capacitor plate; a capacitor dielectric layer formed over a second portion of the upper surface of the first capacitor plate and extending laterally beyond the spacer to contact the semiconductor substrate; a contact in an interlayer dielectric (ILD), the contact contacting the silicide layer and a first metal layer over the ILD; and a second capacitor plate over the capacitor dielectric layer, wherein a metal-insulator-metal (MIM) capacitor is formed by the first capacitor plate, the capacitor dielectric layer and the second capacitor plate and a metal-insulator-semiconductor (MIS) capacitor is formed by the second capacitor plate, the capacitor dielectric layer and the semiconductor substrate.

17 Claims, 11 Drawing Sheets

(56) References Cited

U.S. PATENT DOCUMENTS

| | | |
|---|---|---|
| 7,262,107 B2 | 8/2007 | Tang et al. |
| 7,282,757 B2 | 10/2007 | Tu et al. |
| 7,361,950 B2 | 4/2008 | Chinthakindi et al. |
| 7,741,656 B2 * | 6/2010 | Nakayama et al. ............ 257/159 |
| 7,838,358 B2 * | 11/2010 | Omura ........................... 438/215 |
| 7,888,773 B2 * | 2/2011 | Won et al. ..................... 257/532 |
| 2002/0119622 A1 | 8/2002 | Steigerwald et al. |
| 2004/0124477 A1 * | 7/2004 | Minami et al. ................ 257/379 |
| 2005/0269663 A1 * | 12/2005 | Minami et al. ................ 257/510 |
| 2007/0148856 A1 * | 6/2007 | Shin ............................... 438/238 |
| 2007/0158714 A1 | 7/2007 | Eshun et al. |
| 2007/0267673 A1 | 11/2007 | Kim et al. |
| 2010/0032741 A1 * | 2/2010 | Ueno ............................ 257/298 |
| 2011/0115005 A1 | 5/2011 | Coolbaugh et al. |

OTHER PUBLICATIONS

U.S. Appl. No. 12/618,830, filed Nov. 16, 2009, Office Action dated Jul. 11, 2011.

* cited by examiner

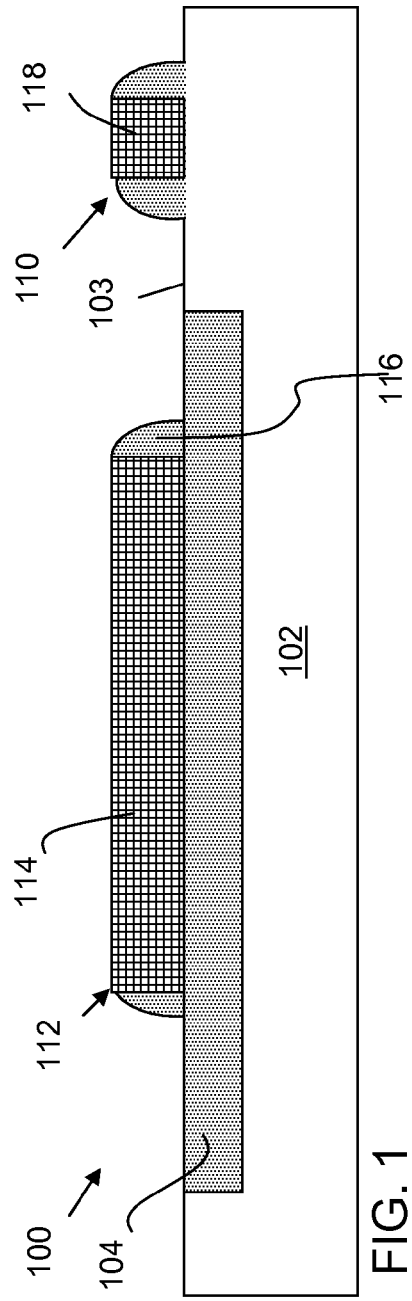
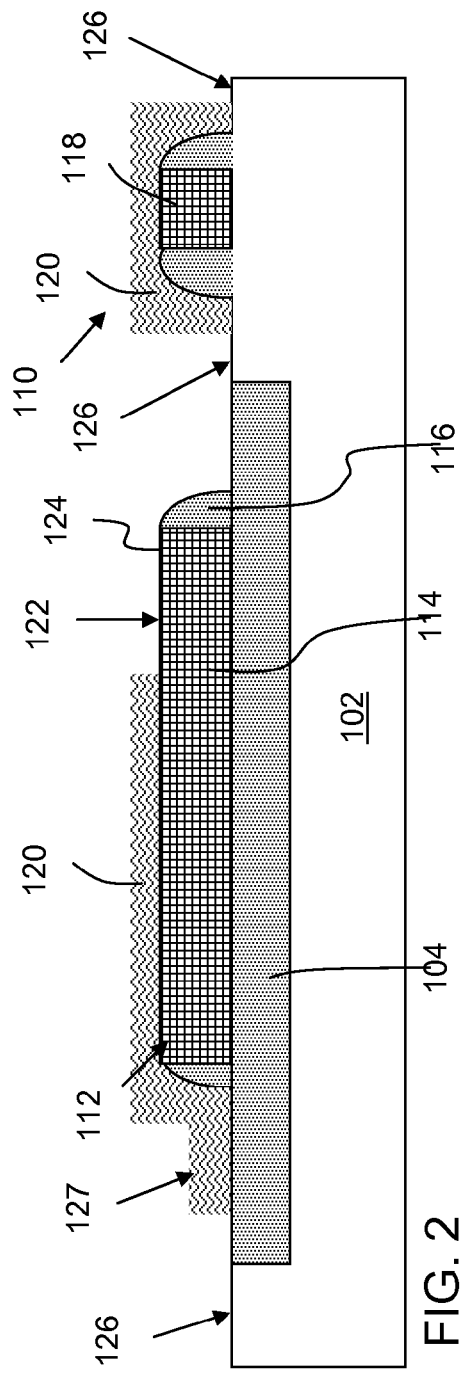

METHOD OF FORMING MIM CAPACITOR STRUCTURE IN FEOL

CROSS-REFERENCE TO RELATED APPLICATIONS

This application is a divisional of U.S. patent application Ser. No. 12/618,830, filed on Nov. 16, 2009, now U.S. Pat. No. 8,125,049 which received a Notice of Allowance on Oct. 26, 2011.

BACKGROUND

1. Technical Field

The disclosure relates generally to metal-insulator-metal (MIM) capacitors, and more particularly, to a front-end-of-line MIM capacitor structure and a related method.

2. Background Art

Back-end-of-line (BEOL) metal-insulator-metal (MIM) capacitors and front-end-of-line (FEOL) deep trench capacitors are commonly used for both precision and decoupling capacitor applications. These capacitors require the use of several additional lithographic masks and associated processes to generate. In addition, both FEOL deep trench and BEOL MIM capacitors are physically far away from the metal-oxide semiconductor field effect transistors (MOSFET) circuits which use them. The multiple wiring levels separating them create a high resistance load.

BRIEF SUMMARY

A first aspect of the disclosure provides a metal-insulator-metal (MIM) capacitor comprising: a semiconductor substrate; a dielectric filled trench isolation formed in the semiconductor substrate; a first capacitor plate positioned on and within the boundaries of the trench isolation, the first capacitor plate including a polysilicon structure having a surrounding spacer; a silicide layer formed in a first portion of an upper surface of the first capacitor plate; a capacitor dielectric layer formed over a second portion of the upper surface of the first capacitor plate; a contact in an interlayer dielectric (ILD), the contact contacting the silicide layer and a first metal layer over the ILD; and a second capacitor plate over the capacitor dielectric layer, the second capacitor plate including one of: a metal plate formed in the ILD and including an upper surface in direct contact with a lower surface of the first metal layer, or a metal plate formed in the ILD that constitutes part of the first metal layer.

A second aspect of the disclosure provides a capacitor structure comprising: a base including a semiconductor substrate having a surface; a first capacitor plate positioned on the semiconductor substrate, the first capacitor plate including a polysilicon structure having a surrounding spacer; a silicide layer formed in a first portion of an upper surface of the first capacitor plate; a capacitor dielectric layer formed over a second portion of the upper surface of the first capacitor plate and extending laterally beyond the spacer to contact the semiconductor substrate; a contact in an interlayer dielectric (ILD), the contact contacting the silicide layer and a first metal layer over the ILD; and a second capacitor plate over the capacitor dielectric layer, wherein a metal-insulator-metal (MIM) capacitor is formed by the first capacitor plate, the capacitor dielectric layer and the second capacitor plate and a metal-insulator-semiconductor (MIS) capacitor is formed by the second capacitor plate, the capacitor dielectric layer and the semiconductor substrate.

A third aspect of the disclosure provides a method comprising: providing a semiconductor substrate; forming a first capacitor plate over the semiconductor substrate, the first capacitor plate including a polysilicon structure having a surrounding spacer; depositing a capacitor dielectric layer over the first capacitor plate and the semiconductor structure; patterning the capacitor dielectric layer to expose a first portion of an upper surface of the first capacitor plate and selected portions of the semiconductor substrate; forming a silicide layer in the first portion and the exposed selected portions; depositing an interlayer dielectric (ILD) forming a contact in the ILD, the contact contacting the silicide layer in the first region; forming a second capacitor plate over the capacitor dielectric layer over at least the first capacitor plate, the second capacitor plate including one of: a metal plate formed in the ILD and including an upper surface in direct contact with a lower surface of a first metal layer, or a metal plate formed in the ILD that constitutes part of the first metal layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1-8 show cross-sectional views of embodiments of a method according to the invention, with FIGS. 4-7 also showing embodiments of a capacitor structure according to embodiments of the invention.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 3:
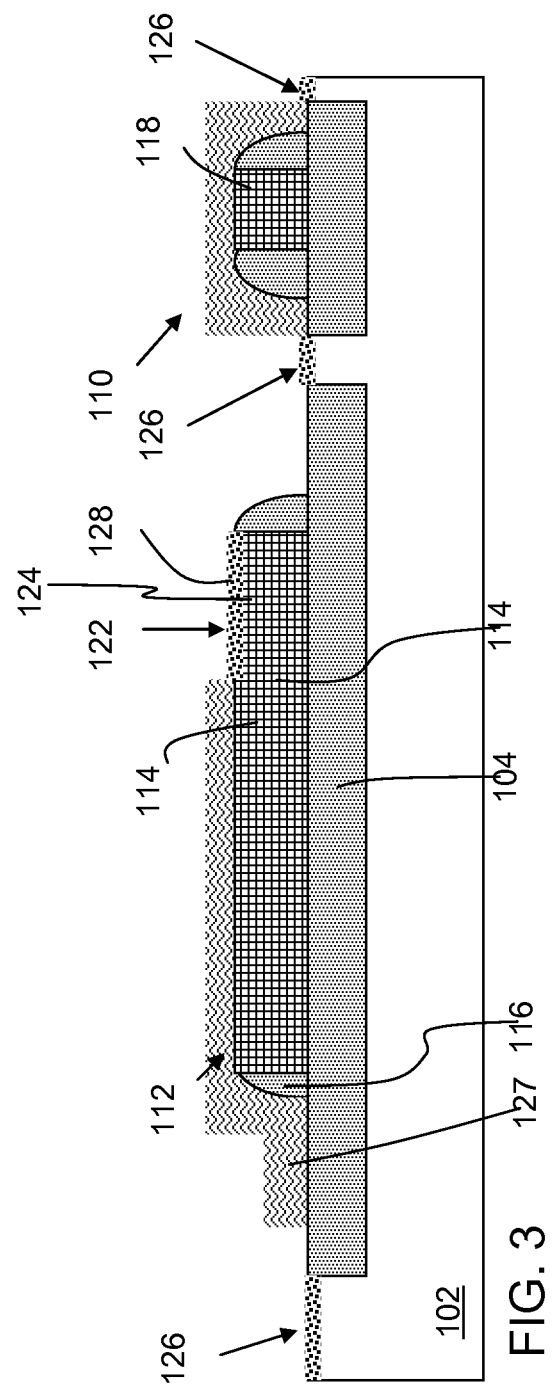

Referring to FIGS. 1-8, cross-sectional views of one embodiment of a method of forming a capacitor structure including a metal-insulator-metal (MIM) capacitor in a front-end-of-line process is illustrated. "Front-end-of-line" indicates any fabrication operations performed on the semiconductor wafer in the course of device manufacturing up to a first metallization.

FIG. 1 shows a cross-sectional view of a structure 100 after some processing according to embodiments of the invention. Embodiments of the method begin by providing a semiconductor substrate 102. Semiconductor substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained.

In one embodiment of the method, a trench isolation 104 is formed in an upper surface 103 of semiconductor substrate 102. Trench isolation 104 may be formed using any now known or later developed techniques, e.g., forming an opening in semiconductor substrate 102 by patterning a mask and etching, and filling with a dielectric. Trench isolation 104 may include any appropriate dielectric such as silicon oxide ($SiO_2$). In addition, at this stage, conventional device fabrication processes, not shown, such as ion implants, anneals and oxidizations may be performed relative to forming a transistor device 110. The resulting structures (e.g., source/drain regions for transistor device 110, gate dielectric under a gate structure 118 and a first capacitor plate 112) from these conventional processes has been omitted for clarity.

FIG. 1 also shows forming a first capacitor plate 112 over semiconductor substrate 102. As illustrated, first capacitor plate 112 may include a polysilicon structure 114 having a surrounding spacer 116. First capacitor plate 112 may be positioned on and within boundaries of trench isolation 104, i.e., it does not extend laterally beyond an edge of the trench isolation. First capacitor plate 112 may be created simultaneously with a gate structure 118 for transistor device 110. For example, a polysilicon layer may be deposited over semiconductor substrate 102, which may then be patterned to create first capacitor plate 112 and gate structure 118. Spacer 116 formation by depositing a dielectric and etching completes this process. Spacer 116 may include any conventional spacer material, e.g., silicon nitride ($Si_3N_4$). As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 2 shows depositing a capacitor dielectric layer 120 over first capacitor plate 112 and semiconductor structure 102 (after capacitor dielectric layer 120 has been patterned). In one embodiment, capacitor dielectric layer 120 includes silicon nitride ($Si_3N_4$) having a thickness of approximately 20-50 nm. While referred to herein as 'capacitor dielectric layer 120' because it forms a dielectric portion of a capacitor, capacitor dielectric layer 120 also acts as a blocking mask for silicide formation where layers thereunder are exposed. That is, capacitor dielectric layer 120 acts as a mask for a silicide layer for the MIM capacitor being formed and another region of semiconductor substrate 102 and/or on semiconductor substrate 102. In particular, unsilicided resistors (not shown) are used in FEOL processing by depositing a thin layer of SiN over the entire wafer, patterning and removing the SiN layer in areas where silicide formation is required, cleaning the wafer, depositing a layer of refractory metal, such as Co, Ti, or Ni, annealing the wafer to form self-aligned silicide (salicide) on the exposed crystalline silicon and polysilicon, and wet etching the unreacted refractory metal, leaving salicided FET's and contact areas on the wafer. After these processes are complete, the contact level is fabricated in the dielectric layer (not shown) formed between substrate 102 and a first wiring level. In this regard, FIG. 2 shows patterning capacitor dielectric layer 120 to expose a first portion 122 of an upper surface 124 of first capacitor plate 112 and selected portions 126 of semiconductor substrate 102. Selected portions 126 may be any part of semiconductor substrate 102 desired to include silicide, e.g., at source/drain regions (not shown) of transistor device 110. In one embodiment, capacitor dielectric layer 120 patterning also includes leaving a region 127 of capacitor dielectric layer 120 extending beyond surrounding spacer 116 and contacting trench isolation 104.

FIG. 3 shows forming a silicide layer 128 in first portion 122 and exposed selected portions 126. Selected portions 126 may be any part of semiconductor substrate 102 not covered by capacitor dielectric layer 120 or covered by other structure such as isolation region 104. Silicide layer 128 may be formed using any now known or later developed technique, e.g., depositing a metal such as titanium, nickel, cobalt, etc., annealing to have the metal react with silicon or polysilicon, and removing unreacted metal using, for example, a wet chemical etchant.

Figure 4:
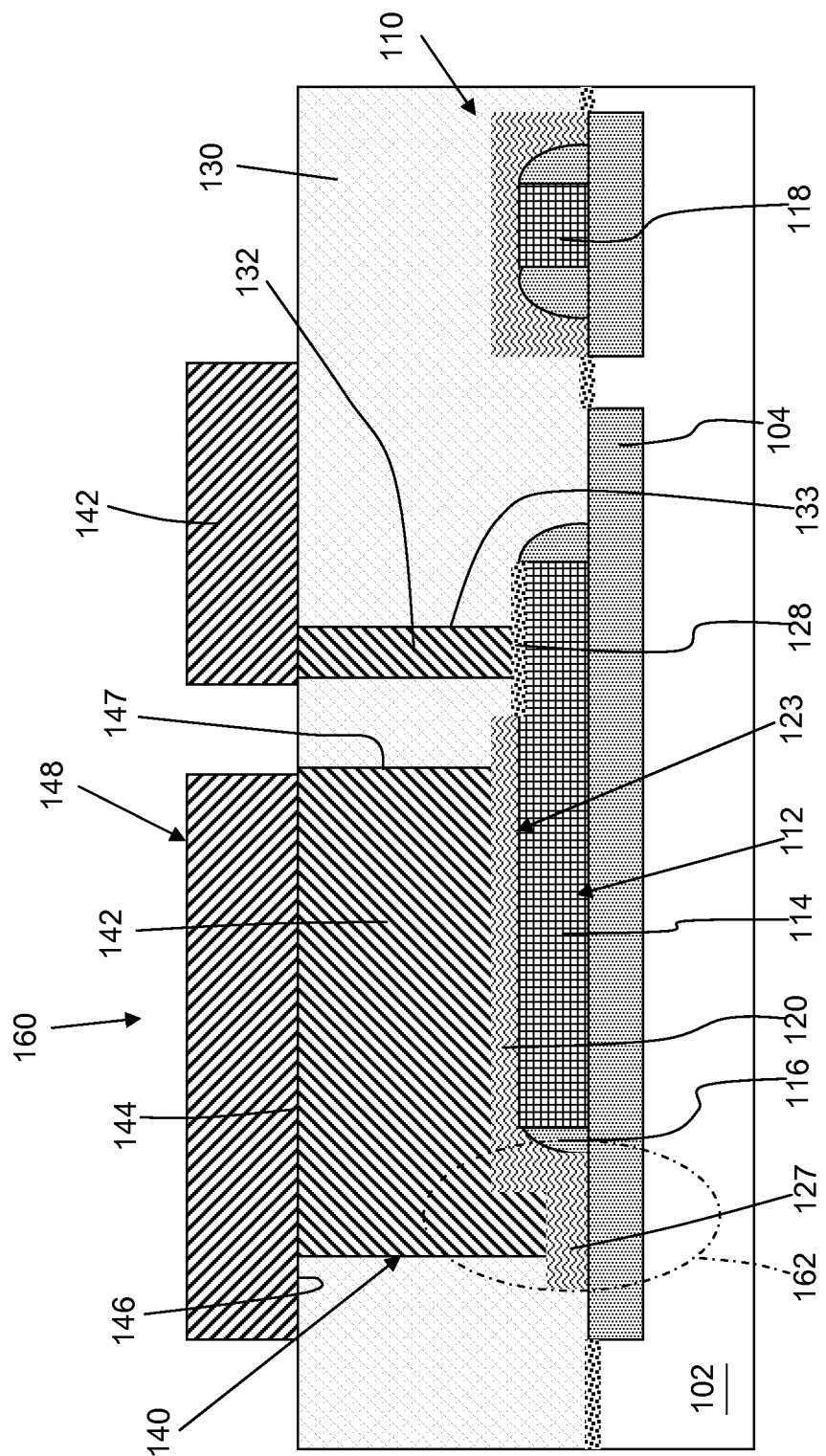

FIG. 4 shows depositing a pre-metal or an interlayer dielectric (hereinafter simply "ILD") 130. ILD 130 may include any now known or later developed dielectric appropriate for a first contact layer such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In another embodiment, ILD 130 may include high dielectric (high-k) dielectrics such as metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). In one embodiment, ILD 130 consists of approximately 500 nm of BPSG.

FIG. 4 also shows forming a contact 132 in ILD 130 and a second capacitor plate 140 over capacitor dielectric layer 120 over at least first capacitor plate 112. As illustrated, contact 132 contacts silicide layer 128 in first region 122, thus creating an electrical connection to first capacitor plate 112. Contact 132 may be formed using any now known or later developed technique. For example, contact 132 may be formed by planarizing ILD 130, patterning and etching contacts through both ILD 130 and capacitor dielectric layer 120, cleaning the wafer, depositing a refractory metal liner, depositing CVD tungsten, and planarizing the tungsten to form the contact. Refractory metal liners may include, e.g., ruthenium (Ru), tantalum (Ta), titanium (Ti), tungsten (W), iridium (Ir), rhodium (Rh) and platinum (Pt), etc., nitridized versions thereof, e.g. TiN, or mixtures thereof. Contact 132 and second capacitor plate 140 may include tungsten or other conductors, e.g., copper, aluminum, etc.

Second capacitor plate 140 may be formed in a number of ways. In one embodiment, shown in FIG. 4, second capacitor plate 140 may be formed with contact 132, e.g., either as a separate damascene process or as part of a dual damascene process. In this case, second capacitor plate 140 includes a metal plate 142 formed in ILD 130 and including an upper surface 144 in direct contact with a lower surface 146 of a first metal layer 148. An upper end of contact 132 is coplanar with upper surface 144 of second capacitor plate 140. In addition, in one embodiment, second capacitor plate 140 may be formed to extend laterally beyond surrounding spacer 116 and contact region 127 of capacitor dielectric layer 120 for reasons to be described elsewhere herein.

Figure 5:
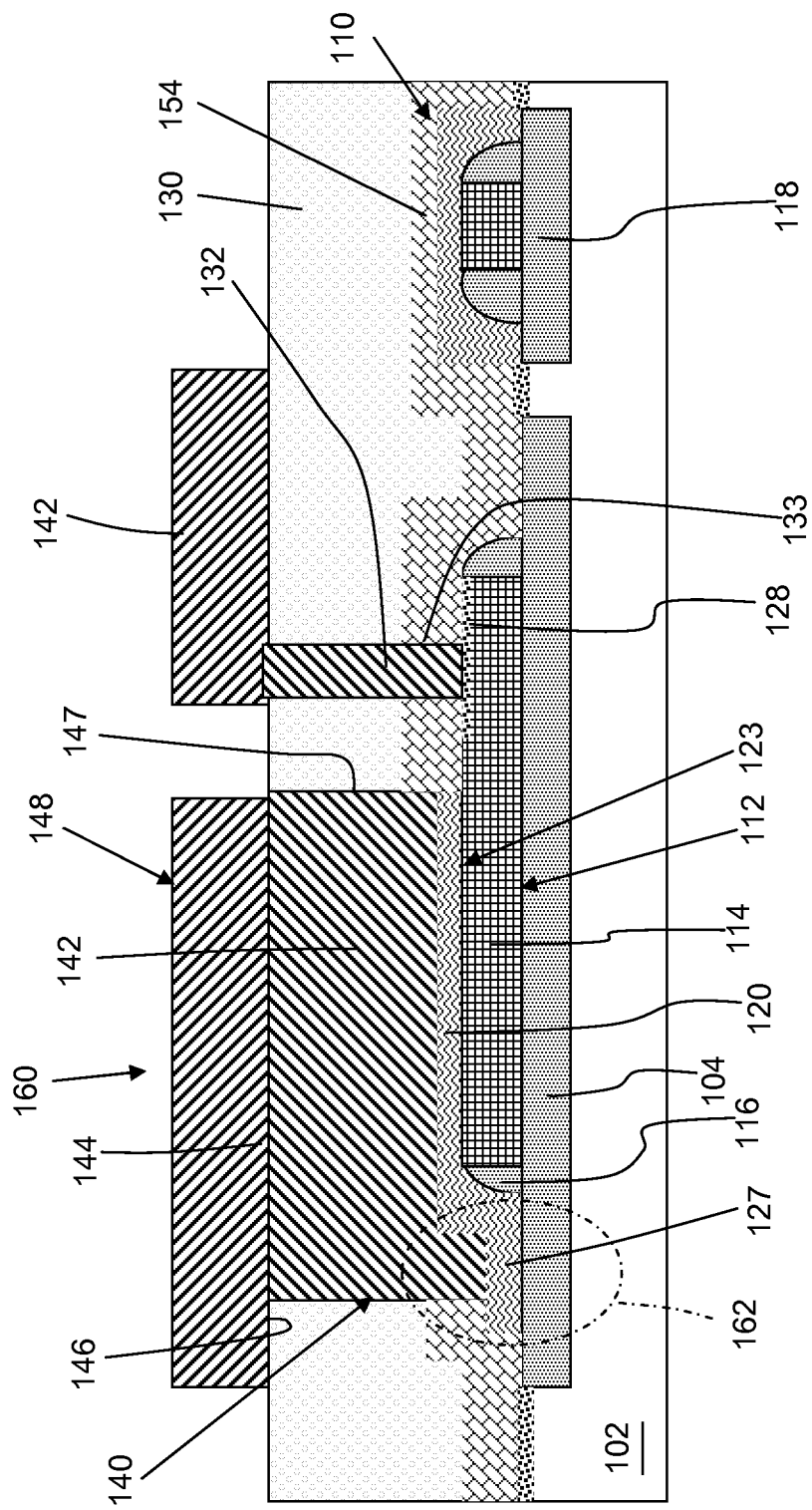

In one embodiment, second capacitor plate 140 and contact 132 forming may be performed without using an etch stop layer, i.e., for layers below plate 140 and contact 132. In this case, a contact opening 133 and a second capacitor plate opening 147 may be etched in ILD 130 with the etching being selective to capacitor dielectric layer 120. The etching is followed by performing a reactive preclean so as not to damage capacitor dielectric layer 120. Alternatively, as shown in FIG. 5, an etch stop layer 154, e.g., of silicon nitride or other dielectric that is selective to, i.e., etches slower than, ILD 130, may be used over capacitor dielectric layer 120 and silicide layer 128. In one example, etch stop layer 154 is approximately 40 nm thick. Second capacitor plate 140 forming and contact 132 forming would include selectively etching through etch stop layer 154 to capacitor dielectric layer 120. In any event, contact 132 forming and metal plate 142 forming may include depositing a refractory metal liner (not shown), depositing a metal, e.g., copper or aluminum, in contact opening 133 and second capacitor plate opening 147, and planarizing the metal prior to forming first metal layer 148. Etch stop layer 154 and capacitor dielectric layer 120 can be formed of the same or different dielectrics. If etch stop layer 154 is a different dielectric than capacitor dielectric layer 120, then etch stop layer 154 could be removed selectively, using either a wet or dry (i.e., RIE) etch process to capacitor dielectric layer 120, to minimize surface damage to the capacitor dielectric. In one example, etch stop layer 154 is $Si_3N_4$, capacitor dielectric layer 120 is a sandwich of $Al_2O_3/Ta_2O_5/Al_2O_3$, and the $Si_3N_4$ is etched using dilute phosphoric acid, selectively to capacitor dielectric layer 120.

First metal layer 148 is formed in any now known or later developed manner, e.g., by forming wires using subtractive-etch or damascene processes using metals such as copper or aluminum, which are lined with refractory metals, as known in the art, and patterning them to form wires.

Figure 6:
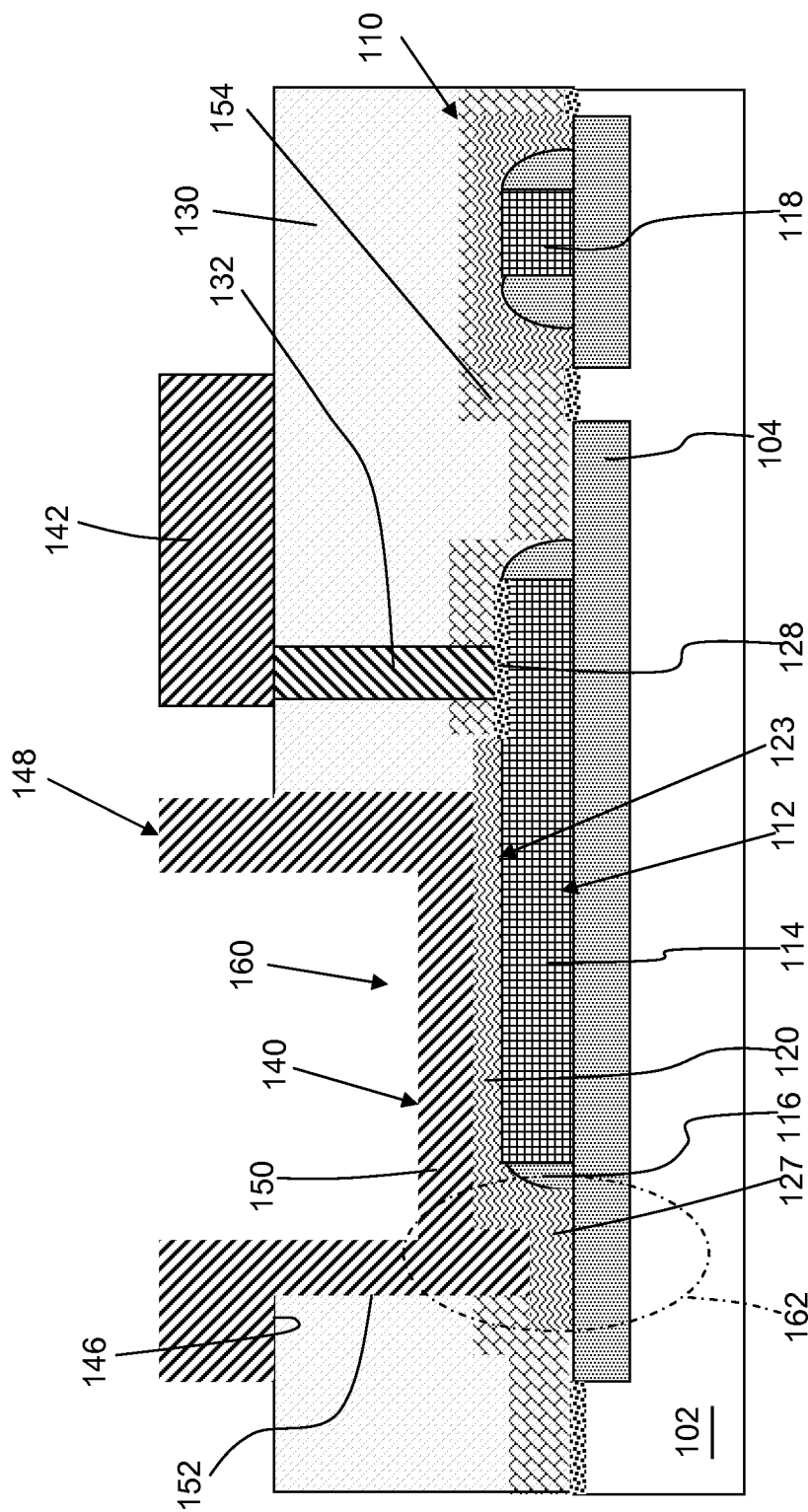

In an alternative embodiment, shown in FIG. 6, second capacitor plate 140 may include a metal plate 150 formed in ILD 130 that constitutes part of first metal layer 148. In this case, an etch stop layer 154 may be employed. A second capacitor plate opening (e.g., a trench) 152 may be formed in ILD 130, through etch stop layer 154 and first metal layer 148 deposition may be performed with patterning of the metal to form the second capacitor plate as part of first metal layer 148. As understood, a refractory metal liner, not shown, may be employed to prevent metal diffusion into ILD 130. As discussed supra, etch stop layer 154 could be removed selectively to capacitor dielectric layer 120 to minimize surface damage to the capacitor dielectric.

Returning to FIGS. 4 and 6, embodiments of metal-insulator-metal (MIM) capacitor 160 created by certain embodiments of the above-described processing is illustrated. MIM capacitor 160 includes a base including semiconductor substrate 102 having surface 103 (FIG. 1). Trench isolation 104 is formed in semiconductor substrate 102. First capacitor plate 112 is positioned on and within the boundaries of trench isolation 104 and includes a polysilicon structure 114 having surrounding spacer 116. Polysilicon structure 114 of first capacitor plate 112 is in the same layer as a polysilicon gate structure 118 of transistor device 110. Silicide layer 128 is formed in first portion 122 (FIG. 2) of upper surface 124 (FIG. 2) of first capacitor plate 112. Capacitor dielectric layer 120 is formed over a second portion 123 of upper surface 124 (FIG. 2) of first capacitor plate 112. Contact 132 is in ILD 130 and contacts silicide layer 128 and first metal layer 148 over ILD 130. Second capacitor plate 140 is over capacitor dielectric layer 120 and includes, as shown in FIG. 4, metal plate 142 formed in ILD 130 and including upper surface 144 in direct contact with lower surface 146 of first metal layer 148, or, as shown in FIG. 6, metal plate 150 formed in ILD 130 that constitutes part of first metal layer 148. In one embodiment, region 127 of capacitor dielectric layer 120 extends beyond surrounding spacer 116 and contacts trench isolation 104. Further, second capacitor plate 140 extends laterally beyond surrounding spacer 116 and contacts region 127 of capacitor dielectric layer 120. This arrangement creates MIM capacitor 160 including first capacitor plate 112, capacitor dielectric layer 120 and second capacitor plate 140, and a metal-insulator-semiconductor (MIS) capacitor 162 (shown in phantom) including second capacitor plate 140, capacitor dielectric layer 120, trench isolation 104 and semiconductor substrate 102, the latter of which may be doped to be appropriately conductive. A separate contact (not shown) to semiconductor substrate 102 may be created, if necessary, in a known fashion. In one embodiment, the lowest film in metal layers 140 or 150 would be TiN deposited by PVD or CVD.

As shown in FIGS. 4 and 6, second capacitor plate 140 and contact 132 may be devoid of an etch stop layer, or as shown in FIG. 5, etch stop layer 154 may be present over capacitor dielectric layer 120 and silicide layer 128. In this case, second capacitor plate 140 and contact 132 extend through the etch stop layer.

Figure 7:
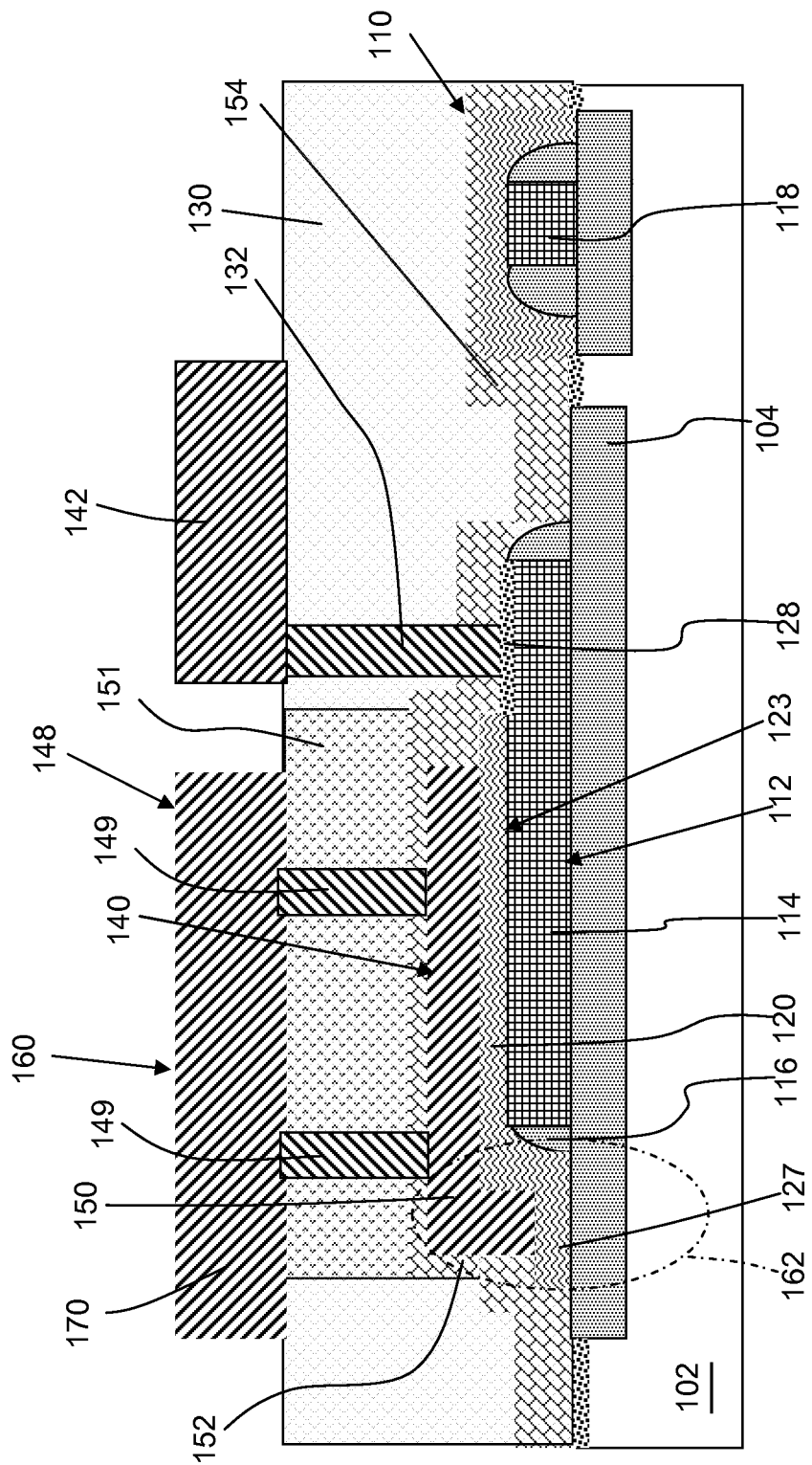
Figure 8:
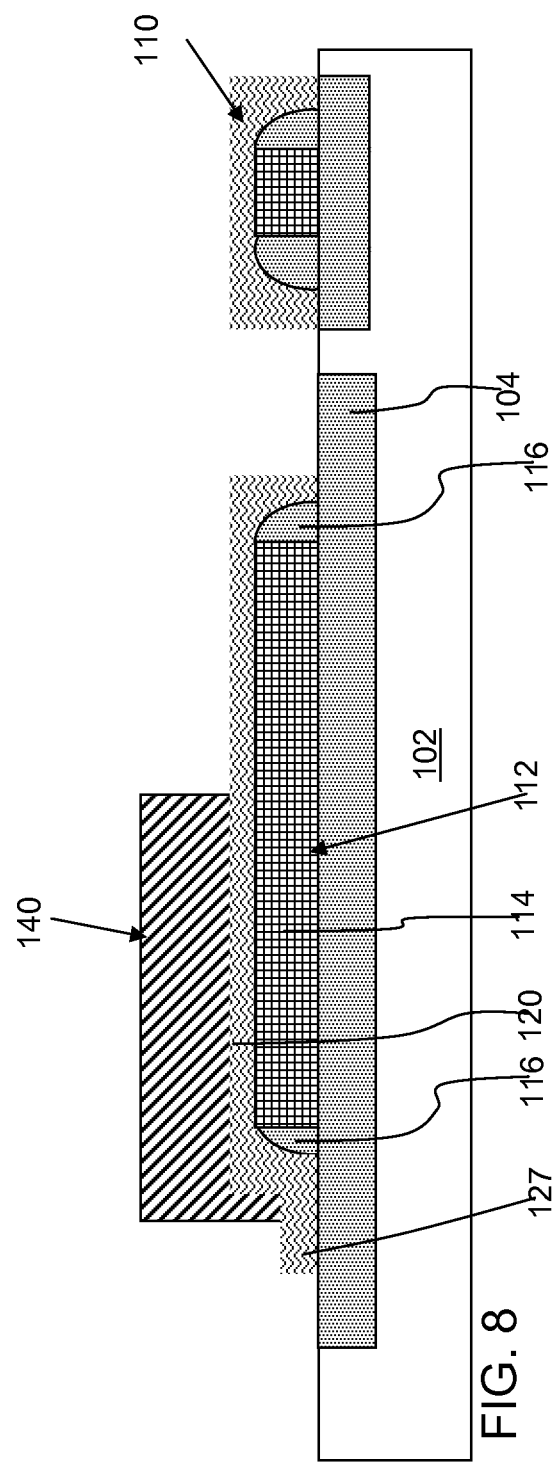
Figure 9:
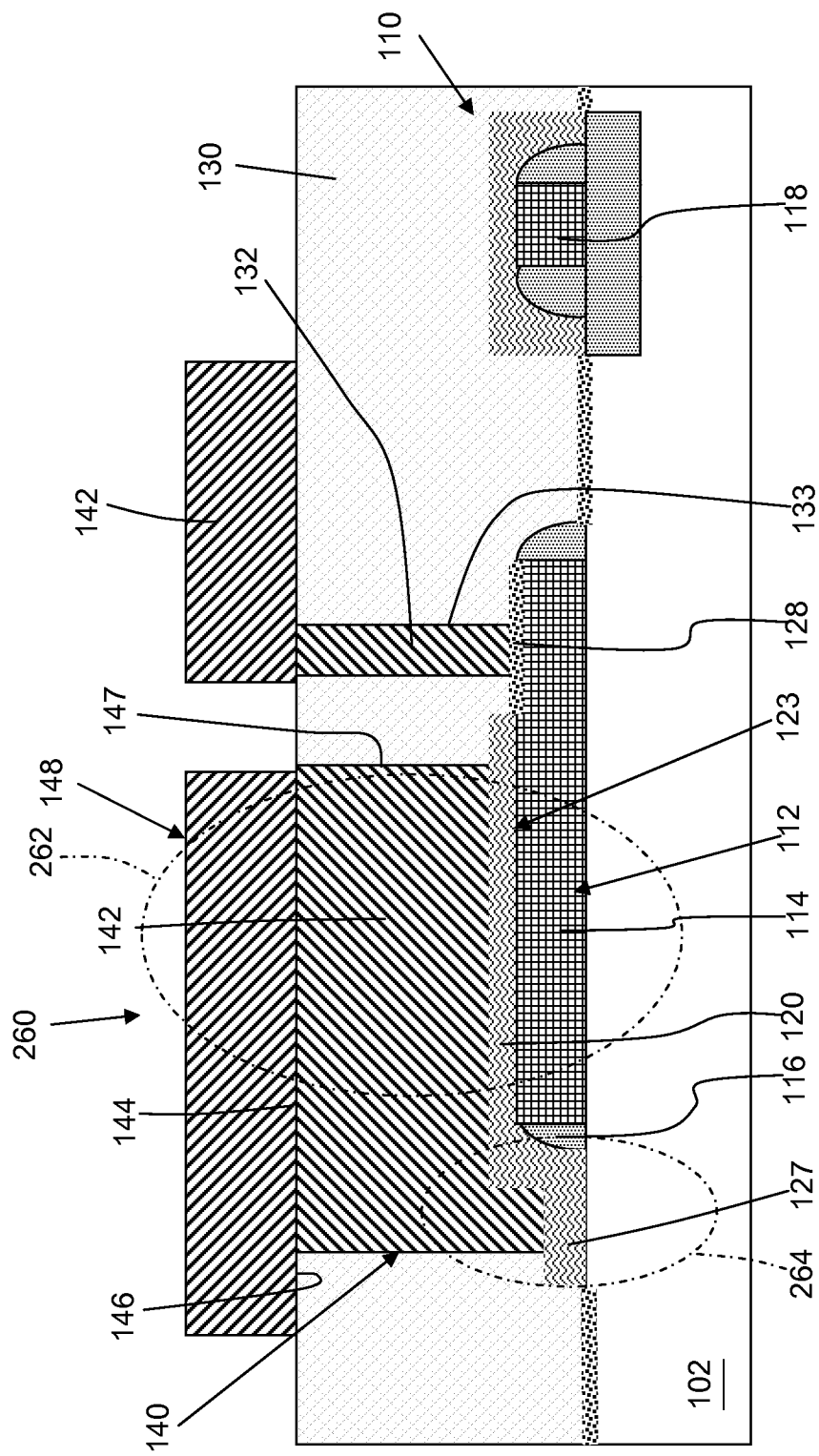
FIGS. 9-12 show cross-sectional views of other embodiments of a capacitor structure according to embodiments of the invention.
Figure 10:
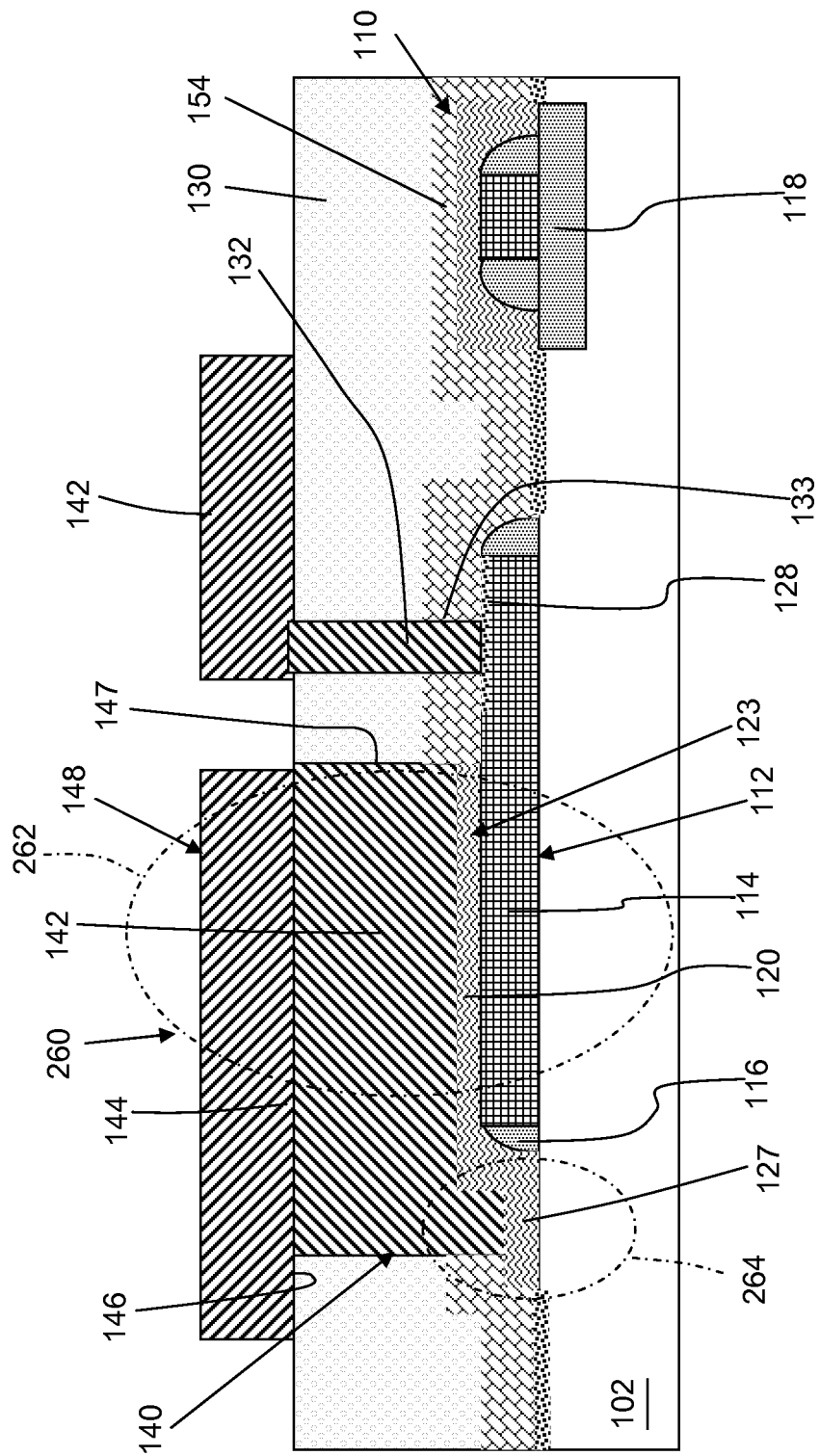
Figure 11:
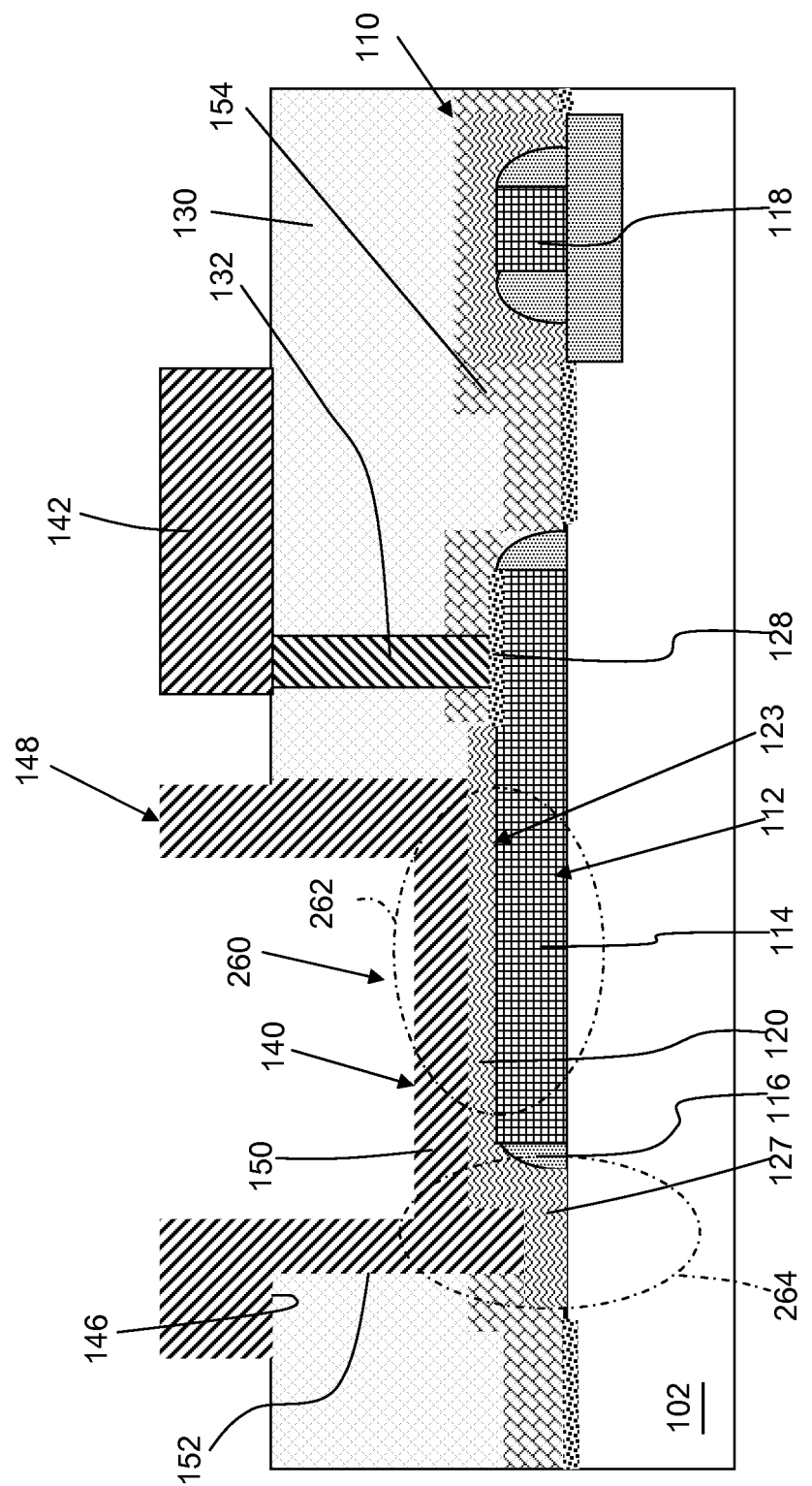

In another alternative embodiment, shown in FIG. 7, a wire 170 may be coupled to second capacitor plate 140 through ILD 130 by one or more contacts 149. Second capacitor plate 140 would be formed inside a trench in ILD 130 and then a dielectric layer 151 would be deposited and planarized. Alternatively, as shown in FIG. 8, second capacitor plate 140 may be formed over capacitor dielectric layer 120 prior to deposition of ILD 130 and using a subtractive etch process. As shown in FIG. 7, an etch stop layer 154 may be employed, and contacts 149 may be created similarly to contact 132. Wire 170 may constitute part of first metal layer 148.

Referring to FIGS. 9-12, cross-sectional views of embodiments of a method of forming a capacitor structure 260 including a MIM capacitor 262 and a MIS capacitor 264 in a FEOL process are illustrated. These embodiments are substantially similar to that of FIGS. 4-7, respectively, except that trench isolation 104 has been omitted. That is, first capacitor plate 112 is formed directly on semiconductor substrate 102 (as noted above any gate dielectric layer that may have been formed during formation of polysilicon structure 114 and gate structure 118 has been omitted for clarity). All other processing may be substantially similar to that described above relative to FIGS. 1-8. Capacitor structure 260 includes semiconductor substrate 102 having surface 103 (FIG. 1), first capacitor plate 112 positioned on semiconductor substrate 102. First capacitor plate 112 includes polysilicon structure 114 having surrounding spacer 116. Silicide layer 128 is formed in first portion 122 (FIGS. 2-3) of upper surface 124 (FIGS. 2-3) of first capacitor plate 112. Capacitor dielectric layer 120 is formed over second portion 123 of upper surface 124 (FIGS. 2-3) of first capacitor plate 112 and extending laterally beyond surrounding spacer 116 to contact semiconductor substrate 102. Contact 132 in ILD 130 contacts silicide layer 128 and first metal layer 148 over the ILD.

A second capacitor plate 140 is positioned over capacitor dielectric layer 120. The above-described structure provides MIM capacitor 262 formed by first capacitor plate 112, capacitor dielectric layer 120 and second capacitor plate 140, and MIS capacitor 264 formed by second capacitor plate 140, capacitor dielectric layer 120 and semiconductor substrate 102. Semiconductor plate 102, at least within region 127 of capacitor dielectric layer 120, may be doped to create the appropriate conductivity.

Figure 12:
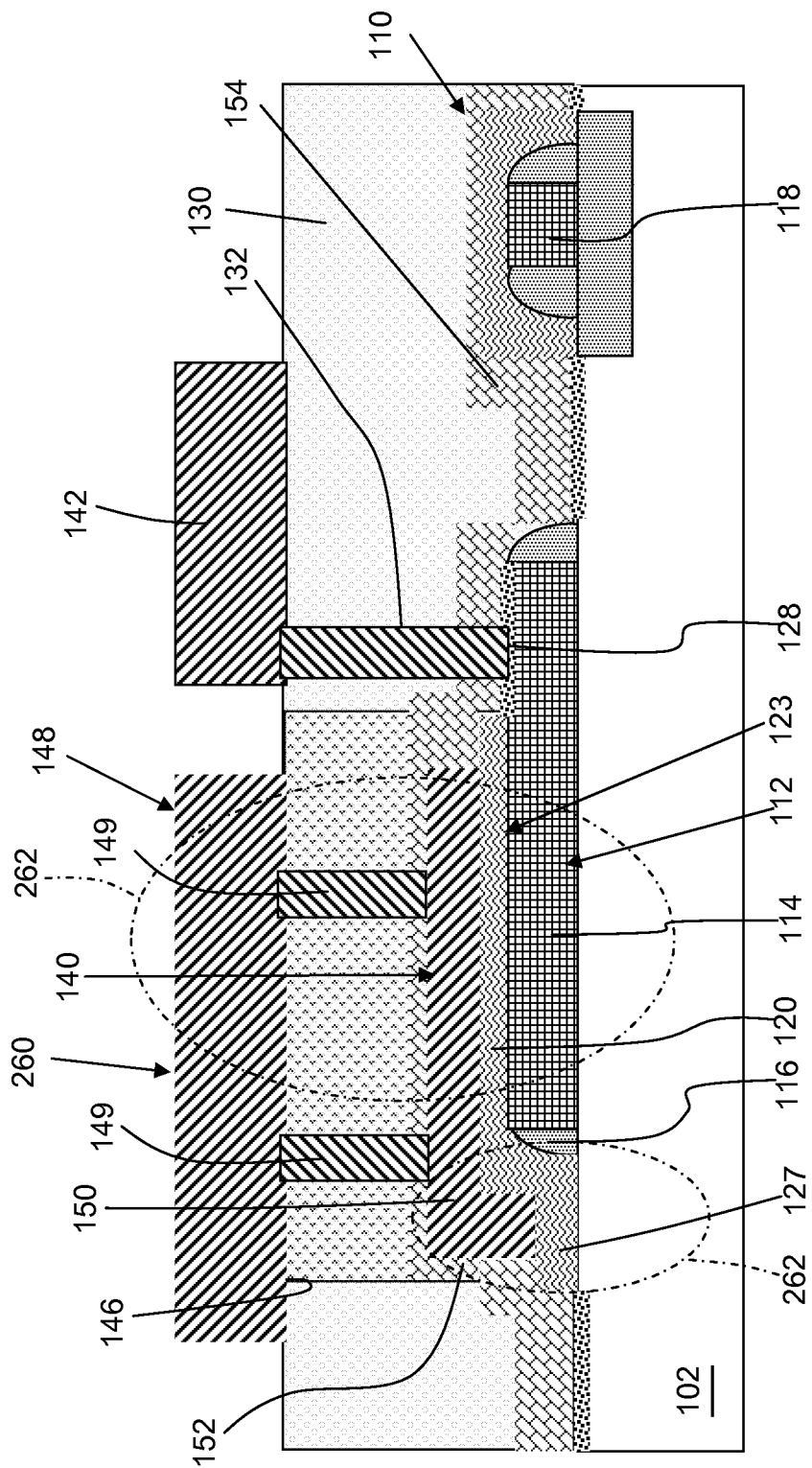

While three plate capacitors (with wire 170) have been shown only relative to the embodiments of FIGS. 7 and 12, a third plate or more plates may be similarly added above any embodiment shown using, for example, additional dielectric and metal layers of the back-end-of-line processing. In addition, structure shown in FIGS. 4-6 and 9-11 may constitute three plate capacitors using semiconductor substrate 102 as the third plate and a gate dielectric layer (not shown) as a capacitor dielectric.

The above-described embodiments provide a low cost (zero or one mask) precision capacitor structure formed in the contact level during IC processing, which allows for direct contacting of transistor devices 110.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
providing a semiconductor substrate;
forming a first capacitor plate over the semiconductor substrate, the first capacitor plate including a polysilicon structure having a surrounding spacer;
depositing a capacitor dielectric layer over the first capacitor plate and the semiconductor structure;
patterning the capacitor dielectric layer to expose a first portion of an upper surface of the first capacitor plate and selected portions of the semiconductor substrate,
wherein the patterning of the capacitor dielectric layer includes leaving a region of the capacitor dielectric layer extending beyond the surrounding spacer and contacting the semiconductor structure;
forming a silicide layer in the first portion and the exposed selected portions;
depositing an interlayer dielectric (ILD);
forming a contact in the ILD, the contact contacting the silicide layer in the first region;
forming a second capacitor plate over the capacitor dielectric layer over at least the first capacitor plate, the second capacitor extending laterally beyond the surrounding spacer and contacting the region of the capacitor dielectric layer,
the second capacitor plate including one of:
a metal plate formed in the ILD and including an upper surface in direct contact with a lower surface of a first metal layer, or
a metal plate formed in the ILD that constitutes part of the first metal layer.

2. The method of claim 1, further comprising:
forming a dielectric filled trench isolation in an upper surface of the semiconductor substrate prior to forming the first capacitor plate, and wherein the first capacitor plate is positioned on and within the boundaries of the trench isolation.

3. The method of claim 1, wherein the capacitor dielectric layer includes silicon nitride ($Si_3N_4$).

4. The method of claim 1, wherein the second capacitor plate forming and the contact forming are performed without using an etch stop layer.

5. The method of claim 1, further comprising depositing an etch stop layer over the capacitor dielectric layer and the silicide layer, the second capacitor plate forming and the contact forming including selectively etching through the etch stop layer to the capacitor dielectric layer.

6. The method of claim 1, wherein the second capacitor plate forming and the contact forming include:
etching a contact opening and a second capacitor plate opening in the ILD, the etching being selective to the capacitor dielectric layer; and
performing a reactive preclean.

7. The method of claim 6, wherein in the case that the second capacitor plate includes the metal plate formed in the ILD and the upper surface in direct contact with the lower surface of the first metal layer, the second capacitor plate forming and the contact forming include:
  depositing a metal in the contact opening and the second capacitor plate opening; and
  planarizing the metal prior to forming the first metal layer.

8. The method of claim 6, wherein in the case that the second capacitor plate includes the metal plate in the ILD that constitutes part of the first metal layer, the second capacitor plate forming includes:
  depositing a metal in the second capacitor plate opening; and
  patterning the metal to form the second capacitor plate as part of the first metal layer.

9. A method comprising:
  providing a semiconductor substrate;
  forming a first capacitor plate over the semiconductor substrate, the first capacitor plate including a polysilicon structure having a surrounding spacer;
  depositing a capacitor dielectric layer over the first capacitor plate and the semiconductor structure;
  patterning the capacitor dielectric layer to expose a first portion of an upper surface of the first capacitor plate and selected portions of the semiconductor substrate;
  forming a silicide layer in the first portion and the exposed selected portions;
  depositing an etch stop layer over the capacitor dielectric layer and the silicide layer;
  depositing an interlayer dielectric (ILD);
  forming a contact in the ILD, the contact contacting the silicide layer in the first region, wherein the forming of the contact includes selectively etching through the etch stop layer to the capacitor dielectric layer;
  forming a second capacitor plate over the capacitor dielectric layer over at least the first capacitor plate, the second capacitor plate including one of:
    a metal plate formed in the ILD and including an upper surface in direct contact with a lower surface of a first metal layer, or
    a metal plate formed in the ILD that constitutes part of the first metal layer,
  wherein the forming of the second capacitor plate includes selectively etching through the etch stop layer to the capacitor dielectric layer.

10. The method of claim 9, further comprising:
  forming a dielectric filled trench isolation in an upper surface of the semiconductor substrate prior to forming the first capacitor plate, and
  wherein the first capacitor plate is positioned on and within the boundaries of the trench isolation.

11. The method of claim 9, wherein the capacitor dielectric layer includes silicon nitride ($Si_3N_4$).

12. The method of claim 9, wherein the capacitor dielectric layer patterning includes leaving a region of the capacitor dielectric layer extending beyond the surrounding spacer and contacting the semiconductor structure, and the second capacitor plate forming includes forming the second capacitor plate to extend laterally beyond the surrounding spacer and contact the region of the capacitor dielectric layer.

13. The method of claim 9, wherein the second capacitor plate forming and the contact forming are performed without using an etch stop layer.

14. The method of claim 9, further comprising depositing an etch stop layer over the capacitor dielectric layer and the silicide layer, the second capacitor plate forming and the contact forming including selectively etching through the etch stop layer to the capacitor dielectric layer.

15. The method of claim 9, wherein in the case that the second capacitor plate includes the metal plate formed in the ILD and the upper surface in direct contact with the lower surface of the first metal layer, the second capacitor plate forming and the contact forming include:
  depositing a metal in the contact opening and the second capacitor plate opening; and
  planarizing the metal prior to forming the first metal layer.

16. The method of claim 9, wherein in the case that the second capacitor plate includes the metal plate in the ILD that constitutes part of the first metal layer, the second capacitor plate forming includes:
  depositing a metal in the second capacitor plate opening; and
  patterning the metal to form the second capacitor plate as part of the first metal layer.

17. A method comprising:
  forming a dielectric filled trench isolation in an upper surface of a semiconductor substrate;
  forming a first capacitor plate over the semiconductor substrate, the first capacitor plate including a polysilicon structure having a surrounding spacer,
  wherein the first capacitor plate is positioned directly in contact with the trench isolation and positioned within the boundaries of the trench isolation;
  depositing a capacitor dielectric layer over the first capacitor plate and the semiconductor structure;
  patterning the capacitor dielectric layer to expose a first portion of an upper surface of the first capacitor plate and selected portions of the semiconductor substrate;
  forming a silicide layer in the first portion and the exposed selected portions;
  depositing an interlayer dielectric (ILD)
  forming a contact in the ILD, the contact contacting the silicide layer in the first region;
  forming a second capacitor plate over the capacitor dielectric layer over at least the first capacitor plate, the second capacitor plate including one of:
    a metal plate formed in the ILD and including an upper surface in direct contact with a lower surface of a first metal layer, or
    a metal plate formed in the ILD that constitutes part of the first metal layer.

* * * * *